United States Patent
Paquet et al.

(10) Patent No.: US 11,993,719 B2
(45) Date of Patent: May 28, 2024

(54) BORON NITRIDE NANOTUBE COATED SUBSTRATES FOR SINTERING OF METALLIC TRACES BY INTENSE PULSE LIGHT

(71) Applicant: NATIONAL RESEARCH COUNCIL OF CANADA, Ottawa (CA)

(72) Inventors: Chantal Paquet, Ottawa (CA); Jacques Lefebvre, Stoneham-et-Tewkesbury (CA); Jingwen Guan, Ottawa (CA); Patrick Roland Lucien Malenfant, Orleans (CA); Benoit Simard, Ottawa (CA); Yadienka Martinez-Rubi, Ottawa (CA); Arnold Kell, Orleans (CA); Xiangyang Liu, Nepean (CA)

(73) Assignee: National Research Council of Canada, Ottawa (CA)

( * ) Notice: Subject to any disclaimer, the term of this patent is extended or adjusted under 35 U.S.C. 154(b) by 185 days.

(21) Appl. No.: 16/759,227

(22) PCT Filed: Oct. 26, 2018

(86) PCT No.: PCT/CA2018/051357
§ 371 (c)(1),
(2) Date: Apr. 24, 2020

(87) PCT Pub. No.: WO2019/079902
PCT Pub. Date: May 2, 2019

(65) Prior Publication Data
US 2020/0407565 A1 Dec. 31, 2020

Related U.S. Application Data

(60) Provisional application No. 62/650,091, filed on Mar. 29, 2018, provisional application No. 62/578,003, filed on Oct. 27, 2017.

(51) Int. Cl.
*C09C 3/10* (2006.01)
*B41M 3/00* (2006.01)
(Continued)

(52) U.S. Cl.
CPC ............... *C09C 3/10* (2013.01); *B41M 3/006* (2013.01); *B41M 7/0081* (2013.01);
(Continued)

(58) Field of Classification Search
CPC ...... H05K 2201/026; H05K 2203/1131; H01L 23/373; C08K 3/041; C01B 32/15; C09C 3/10
(Continued)

(56) References Cited

U.S. PATENT DOCUMENTS

| 9,972,742 B2 | 5/2018 | Oh et al. |
| 2005/0116336 A1* | 6/2005 | Chopra ............... H01L 23/373 257/E23.11 |

(Continued)

FOREIGN PATENT DOCUMENTS

| CN | 102893421 A | 1/2013 |
| CN | 102893421 A1 | 1/2013 |

(Continued)

OTHER PUBLICATIONS

C. Zhi et al., An Asian Journal, vol. 4, No. 10, Oct. 5, 2009, pp. 1536-1540. (Year: 2009).*
(Continued)

*Primary Examiner* — Tabassom Tadayyon Eslami
(74) *Attorney, Agent, or Firm* — Aventum IP Law LLP

(57) ABSTRACT

A composite includes a plastic substrate and an electrical insulator layer formed on the plastic substrate. The electrical insulator layer contains boron nitride nanotubes (BNNTs), which may be unmodified or modified BNNTS. The composite is suitable for use in making printed electronic
(Continued)

devices. A process includes providing a plastic substrate and forming on at least a portion of a surface of the plastic substrate a layer that contains the BNNTs. A metallic ink trace is formed on a portion of the layer, such that the metallic ink trace is spaced-apart from the substrate. Using photonic or thermal sintering techniques, the metallic ink trace is then sintered.

15 Claims, 16 Drawing Sheets

(51) Int. Cl.
*B41M 7/00* (2006.01)
*C09D 11/037* (2014.01)
*C09D 11/322* (2014.01)
*C09D 11/52* (2014.01)
*H05K 1/03* (2006.01)
*H05K 1/09* (2006.01)
*H05K 3/12* (2006.01)

(52) U.S. Cl.
CPC .......... *C09D 11/037* (2013.01); *C09D 11/322* (2013.01); *C09D 11/52* (2013.01); *H05K 1/0353* (2013.01); *H05K 1/097* (2013.01); *H05K 3/1283* (2013.01); *C01P 2004/13* (2013.01); *H05K 2201/0145* (2013.01); *H05K 2201/0154* (2013.01); *H05K 2201/0158* (2013.01); *H05K 2201/0257* (2013.01); *H05K 2201/026* (2013.01); *H05K 2203/1131* (2013.01)

(58) Field of Classification Search
USPC .......................................................... 257/720
See application file for complete search history.

(56) References Cited

U.S. PATENT DOCUMENTS

| 2010/0051879 | A1* | 3/2010 | Sainsbury | C01B 21/0648 |
| | | | | 977/773 |
| 2011/0203632 | A1* | 8/2011 | Sen | H01L 31/03921 |
| | | | | 438/92 |
| 2011/0226330 | A1* | 9/2011 | Grossman | H01L 31/202 |
| | | | | 136/258 |
| 2012/0143544 | A1* | 6/2012 | Murata | H01L 51/0072 |
| | | | | 257/431 |
| 2013/0065359 | A1 | 3/2013 | Stockum et al. | |
| 2014/0314966 | A1 | 10/2014 | Fink et al. | |
| 2015/0023858 | A1 | 1/2015 | Tour et al. | |
| 2015/0187983 | A1 | 7/2015 | Oh et al. | |
| 2015/0249167 | A1* | 9/2015 | Zhang | H01B 13/30 |
| | | | | 252/512 |
| 2016/0025431 | A1 | 1/2016 | Starkovich et al. | |
| 2016/0137502 | A1 | 5/2016 | Hopkins et al. | |
| 2016/0322133 | A1 | 11/2016 | Kim et al. | |
| 2019/0022750 | A1* | 1/2019 | Kim | B33Y 70/00 |

FOREIGN PATENT DOCUMENTS

| CN | 104183335 | * | 12/2014 |
| JP | 2010-212004 | * | 9/2010 |
| TW | 201615800 A | | 5/2016 |
| WO | 2008/140583 A3 | | 11/2008 |
| WO | 2011/03634 A1 | | 1/2011 |
| WO | 2011003634 A1 | | 1/2011 |
| WO | 2015/192248 A1 | | 12/2015 |
| WO | 2016/100715 A1 | | 6/2016 |
| WO | 2016100715 A1 | | 6/2016 |
| WO | 2016/197234 A1 | | 12/2016 |
| WO | 2018/018136 A1 | | 2/2018 |
| WO | 2018/146616 A3 | | 8/2018 |
| WO | 2018/146617 A1 | | 8/2018 |
| WO | 2018/146619 A3 | | 8/2018 |

OTHER PUBLICATIONS

Ouyang, Jianying et al—"Sorting of Semiconducting Single-Walled Carbon Nanotubes in Polar Solvents with an Amphiphilic Conjugated Polymer Provides General Guidelines for Enrichment"; ACS Publications, 2018, American Chemical Society, Nano 2018, 12, pp. 1910-1919.
Kell, Arnold J. et al—"Versatile Molecular Silver Ink Platform for Printed Flexible Electronics"; ACS Applied Materials & Interfaces; pp. A-L.
Martinez-Rubi, Yadienka et al—"Self-Assembly and Visualization of Poly(3-hexyl-thiophene) Chain Alignment along Boron Nitride Nanotubes"; NRC Publications Archive; The Journal of Physical Chemistry; 2015—pp. 26606-26610.
Roshanghias, Ali et al—"Sintering Strategies for Inkjet Printed Metallic Traces in 3D Printed Electronics"; IOP Publishing, 2017 Flex. Print. Electron. 2 045002—pp. 1-10.
Gili, Enrico, et al—"Plastic electronics: a neat solution"; University of Cambridge 2017—https://www.cam.ac.uk/research/news/plastic-electronics-a-neat-solution—3 pgs.
Office Action (CN Language) with Summary Translation in English for TW application 107138066, National Research Council of Canada.

* cited by examiner

BORON NITRIDE NANOTUBE COATED SUBSTRATES FOR SINTERING OF METALLIC TRACES BY INTENSE PULSE LIGHT

This application claims the benefit of U.S. Provisional Application No. 62/578,003 filed Oct. 27, 2017 and it also claims the benefit of U.S. Provisional Application No. 62/650,091 filed Mar. 29, 2018. The entire contents of U.S. Provisional Applications No. 62/578,003 and 62/650,091 are incorporated herein by reference.

TECHNICAL FIELD

This disclosure relates to the field of intense pulse light (IPL) sintering. In particular, it relates to the IPL sintering of inks on substrates with low-temperature stability that are coated with boron nitride nanotubes.

BACKGROUND

Intense pulsed light (IPL) sintering is a photonic sintering technique that provides an effective way of sintering materials. The technique is well-suited for printable electronics since it can sinter material on a timescale of milliseconds and therefore readily integrates with roll-to-roll processes. IPL sinters material by generating heat through the absorption by an ink of broadband, high-intensity pulsed light. Heat can be localized to the ink layer if the pulses of light are short enough that thermal equilibrium is not established between the ink and substrate layers. This unique feature of IPL allows processing of inks that require high sintering temperatures on substrates that have low heat stabilities but are generally favored due to their low cost. The pulsed light however, must be carefully optimized for energy density, duration and frequency in order to generate heat that is sufficient to sinter the ink but low enough that the substrate is not significantly damaged.

Currently, metallic inks can be processed using IPL on temperature-sensitive substrates, such as plastic substrates. However, the underlying substrate is often warped due to the high energies required to process the samples. One solution is to provide a coated substrate. As an example, Novele™ is a commercially-available substrate made of polyethylene terephthalate (PET) coated with a relatively thick layer of silica particles. The silica coating minimizes the amount of heat that reaches the substrate, thereby mitigating the damage incurred by the substrate when sintering using IPL.

One of the disadvantages of Novele™ is that it is opaque. As a result, it is not ideal for many printable electronics applications. In addition, metallic traces processed on Novele™ show very poor mechanical stability (e.g. poor adhesion characteristics).

There have been few attempts to address the issue of damage to underlying substrates during IPL sintering of inks.

U.S. Pat. No. 9,972,742 discloses the use of IPL sintering of Ag or Cu nanowires on a substrate (e.g. PET) to improve conductivity of the nanowires without damaging the substrate. The surface of the nanowire may be coated with a metal selected from Au, Pt, Ti, Ni, Al, W and Co.

U.S. Pat. No. 9,972,742 B2 discloses a production method for a transparent electrically-conductive film that includes a step of coating an electrically-conductive nanowire dispersion containing electrically-conductive nanowires with an optical activity and an organic binder onto a substrate; and a step of irradiating a pulse-type white light onto the electrically-conductive nanowires. The substrate includes polycarbonate and polyethylene terephthalate.

WO 2016/100715 discloses the incorporation of aligned high quality boron nitride nanotubes (BNNTs) into groups and bundles that can be placed in electronic and electrical components (ECs). Such use of high quality BNNTs enhances the heat removal and diminishes heat production and dielectric heating. High quality BNNTs are electrically insulating and excellent conductors of heat at the nanoscale level.

US Patent Application No. 2005/0116336 now abandoned discloses nano-composite materials for thermal management applications. One type of nano-composite material disclosed has a base material and nanostructures (e.g., boron nitride nanotubes) dispersed in the base material.

Kell A, et al. (*ACS Applied Materials & Interfaces*. May 3, 2017, DOI: 10.1021/acsami.7b02573) discloses the use of intense pulsed light (IPL) sintering to sinter silver-based molecular inks on plastic substrates (e.g. Kapton™).

SUMMARY

A composite comprising an electrical insulator layer comprising unmodified or modified boron nitride nanotubes (BNNTs) supported on a plastic substrate will first be described in its general form, and then its implementation in terms of embodiments will be detailed hereafter. Modified BNNTs include both i) BNNTs that are modified covalently with functional groups (OH or $NH_2$) and ii) BNNTs that are modified by wrapping them in either in a polymer, a ligand or a surfactant. In the following description and in the appended claims, the term "BNNT" is intended to include any unmodified BNNT or modified BNNT material with properties that make it suitable for forming a composite with a plastic substrate (i.e., forming a coating or a film on a surface of a plastic substrate), supporting a metallic ink trace, and reducing heat transfer to the substrate during sintering of the metallic ink trace, relative to heat transfer to the substrate that would otherwise occur absent the BNNT.

Disclosed herein is the use of BNNT coatings on substrates with low-temperature stability (e.g. plastic substrates), to reduce heat transfer to the substrate during intense pulsed light (IPL) sintering of printed metallic molecular ink traces on the substrate. Reducing heat transfer from a printed trace to the substrate reduces damage to the substrate during IPL sintering. This increases the trace quality, which in turn improves the electrical and mechanical properties of the traces.

Furthermore, compared to the commercially-available Novele™ product, BNNTs provide higher transmission of light, and yield printed films with significantly improved mechanical and electrical properties. Finally, the use of BNNT coatings may mitigate the necessity for careful optimization of energy density, duration and frequency of the light used in the IPL sintering process.

In one aspect, there is provided a composite comprising: a plastic substrate; and an electrical insulator layer disposed on the plastic substrate and comprising boron nitride nanotubes (BNNTs).

In another aspect, there is provided a process for printing electronics, the process comprising sintering a metallic ink on the composite.

In another aspect, there is provided the use of a coating on a plastic substrate for reduction of heat transfer to the substrate during sintering, relative to heat transfer to the substrate that would otherwise occur absent the coating, wherein the coating comprises BNNTs.

The BNNTs may be single-walled or multi-walled. Modified BNNTs may comprise pendant hydroxyl (OH) and amino ($NH_2$) functional groups covalently bonded to an outer surface of the BNNT. The ratio of pendant OH groups to $NH_2$ groups may be about 2:1, while the number of pendant OH groups may be between about 1 OH per 6 BN-units and about 1 OH per 240 BN-units, or between about 1 OH per 12 BN-units and about 1 OH per 124

BN-units, or about 1 OH per 18 BN-units. Alternatively, modified BNNTs may be wrapped with a polymer or coated with a ligand or a surfactant. Where a polymer is used, the polymer may comprise a conjugated polymer, such as (but not limited to), a polythiophene comprising at least one alkyl side chain, a polyfluorene comprising at least one alkyl side chain, a poly(fluorene-co-pyridine) comprising at least one alkyl side chain, or a poly(thiophene-co-fluorene) comprising at least one alkyl side chain.

TABLE I

General examples of the polymer include:

| Structure | Substituents/ Regioregularity | $M_n$* (kDa) | PDI** |
|---|---|---|---|
| 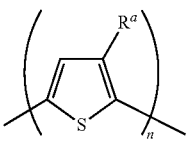 Polythiophene (PT) | $R^a = C_6H_{13}$ Regio-Random | 34 | 1.35 |
| | $R^a = C_6H_{13}$ Regio-Regular | 60 | 2.3 |
| | $R^a = C_{18}H_{37}$ Regio-Regular | 50.9 | 1.35 |
| 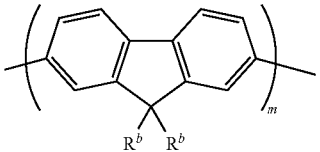 Polyfluorene (PF) | $R^b = C_8H_{17}$ | 22 | 2.41 |
| | $R^b = C_{14}H_{29}$ | 13 | 3 |
| | $R^b = C_{18}H_{37}$ | 59 | 4.5 |
| 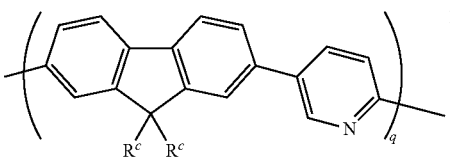 Polyfluorine-Pyridine (PFPy) | $R^c = C_{18}H_{37}$ | 38.5 | 3.21 |

*Number average molecular weight
**Polydispersity index

Additional examples include:
a polythiophene of Formula I:

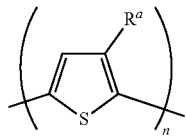

(I)

wherein $R^a$ is $C_{4-24}$ alkyl and n is an integer from 10-200;
a polyfluorene of Formula II:

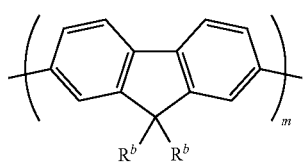

(II)

wherein each $R^b$ is independently $C_{6-24}$ alkyl and m is an integer from 10-100; or a poly(fluorene-co-pyridine) of Formula III:

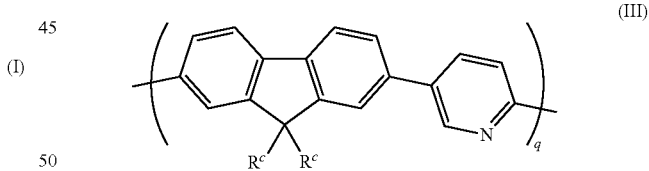

(III)

wherein each $R^c$ is independently $C_{6-24}$ alkyl and q is an integer from 10-100.

In the above, $R^a$ may be n-hexyl or n-octadecyl, $R^b$ may be n-octyl or n-octadecyl; and $R^c$ may be n-octadecyl.

Furthermore, the substrate can comprise polycarbonate (PC), polyethylene terephthalate (PET), polyethylene terephthalate glycol (PETG), polyethylene naphthalate (PEN), polyimide, or a polyester. Plastic materials with low glass transition temperatures, e.g., below about 200° C., such as for instance PETG, PET, PEN and PC, form particularly useful composites when coated with BNNT.

The metallic ink can comprise silver, copper or nickel. As to types of inks, the metallic ink can be a molecular ink, a particulate ink or an ink comprising flakes, or any mixture thereof. Where the metallic ink is a particulate ink, the particulate ink can comprise nanoparticles comprising a metal. In addition, the metallic ink may be a mixture of: a particulate ink of nanoparticles comprising a metal and a molecular ink. With regards to the nanoparticles comprising a metal, the metal may be silver, copper or nickel. In some cases, the metallic ink can comprise flakes of silver, or may be a mixture of an ink comprising flakes of silver and a molecular ink.

A molecular ink is a flake-less ink that does not make use of metallic flakes to provide conductivity. Instead, the molecular ink typically comprises a metal precursor molecule, for example, a metal carboxylate such as a silver carboxylate or bis(2-ethyl-1-hexylamine) copper (II) formate, bis(octylamine) copper (II) formate or tris(octylamine) copper (II) formate. Because the inks do not contain flakes, conductive traces formed from the inks comprise interconnected metal nanoparticles, which permit the formation of very thin and narrow conductive traces. Some molecular inks are described, for example, in WO 2015/192248, WO 2015/192248, WO 2016/197234, WO 2018/018136, WO 2018/146616, WO 2018/146617, WO 2018/146619, etc.

With respect to the process, the metallic ink may be sintered by photonic or thermal sintering. In some embodiments intense pulsed light sintering (IPL) is used. The metallic ink may be applied to the BNNT surface of the composite by screen, inkjet, microplotting, flexure-gravure, offset printing or stencil printing.

In another aspect there is provided a process, comprising: providing a plastic substrate; forming on at least a portion of a surface of the plastic substrate a layer comprising boron nitride nanotubes (BNNTs); forming a metallic ink trace on a portion of the layer, such that the metallic ink trace is spaced-apart from the substrate; and sintering the metallic ink trace using photonic or thermal sintering techniques.

Wherever ranges of values are referenced within this specification, sub-ranges therein are intended to be included, unless otherwise indicated. Where characteristics are attributed to one or another variant of the composite, the process, or the use described above, unless otherwise indicated, such characteristics are intended to apply to all other variants where such characteristics are appropriate or compatible with such other variants.

Further features will be described or will become apparent in the course of the following detailed description.

BRIEF DESCRIPTION OF FIGURES

For clearer understanding, preferred embodiments will now be described in detail by way of example, with reference to the accompanying drawings, in which:

In FIG. 3A, the substrate is coated with BNNT; in FIG. 3B the substrate has no coating.

DETAILED DESCRIPTION

Example 1: Silver Traces Formed on PET Coated with Polymer-Wrapped BNNT by Electrophoretic Deposition/Dry Transfer Samples of PET (Melinex™) substrates coated with a film of polymer-wrapped modified BNNTs were fabricated using a combination of electrophoretic deposition and dry transfer, as described below with reference to FIGS. 1A-1D.

A clear solution (see FIG. 1A) containing modified BNNTs wrapped in regiorandom poly(3-hexylthiophene-2, 5-diyl) (rra-P3HT) and dispersed in chloroform was bath sonicated for 30 minutes prior to electrophoretic deposition on a conductive substrate. Both silicon wafers and a copper coated polyimide (Kapton) film were used with similar results.

Figure 1A:
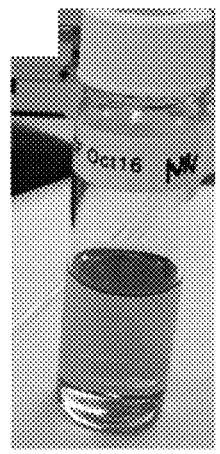
FIGS. 1A-1D provide details of the electrophoretic deposition and dry transfer of polymer-wrapped BNNTs onto Melinex™.
Figure 1B:
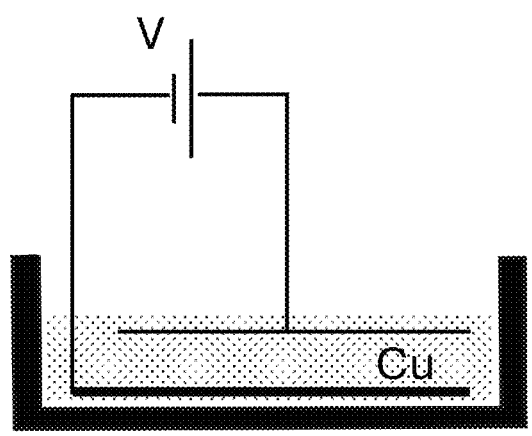

FIG. 1B shows a simplified electrophoretic deposition system. The substrate and counter electrodes sit in a Teflon™ container and are arranged in a plate capacitor configuration 10×10 cm with a 2-3 mm gap between them. The container is filled with the BNNT dispersion and a DC voltage (50-100V) is applied to promote nanotube deposition on the conductive substrate. The deposition time was about 10-20 minutes.

Figure 1C:
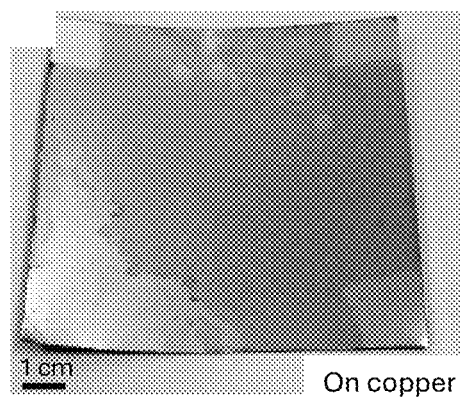
Figure 1D:
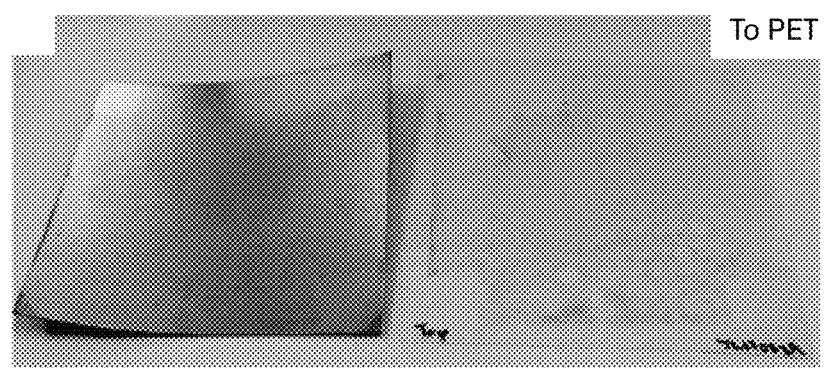

FIG. 1C shows an example of a film of polymer-wrapped BNNTs on copper after deposition and drying. No rinsing was performed on the sample. Transfer of the BNNT film to a PET (Melinex™) substrate was performed by bringing the BNNT film into contact with the front surface of the PET substrate and then mechanically rubbing the back surface of the PET substrate with a Teflon™ rod (approximately 6 mm diameter). The transfer was immediately visible in regions were rubbing had occurred. FIG. 1D shows the copper and Melinex™ substrates after transfer of the film of polymer-wrapped BNNTs onto the Melinex™ substrate.

Figure 2A:
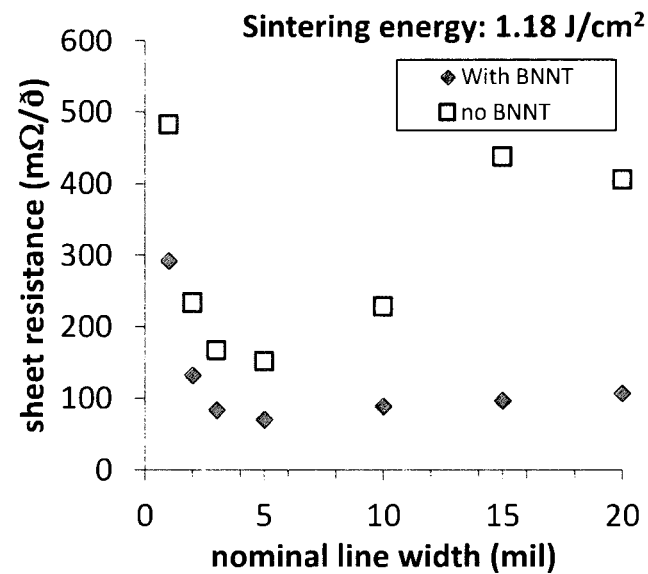
FIGS. 2A-2B illustrate sheet resistance of silver traces vs. their nominal trace width for a series of sintering energies, comparing untreated Melinex™ with Melinex™ coated with polymer-wrapped BNNTs.
Figure 2B:
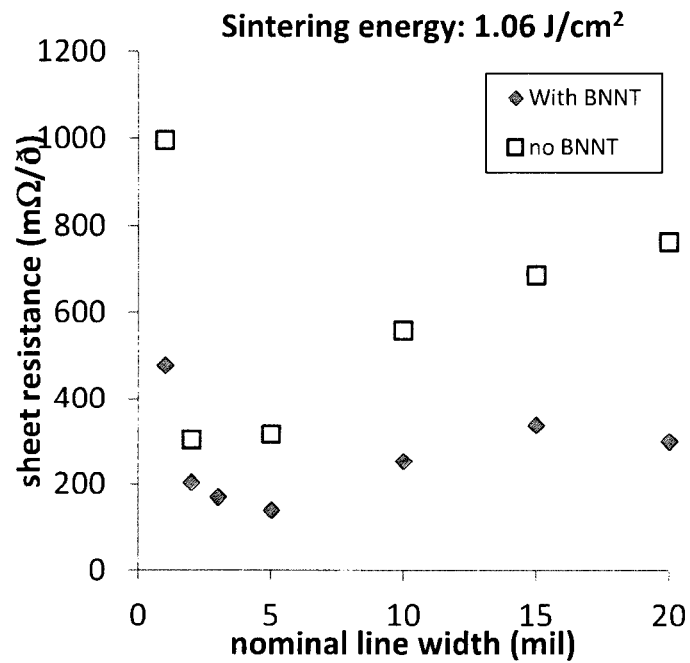

FIGS. 2A-2B are plots of sheet resistance of silver traces vs. the nominal width of the traces for a series of sintering energies and comparing results the obtained for untreated Melinex™ with the results obtained for Melinex™ coated with polymer-wrapped BNNTs.

A set of silver traces with nominal widths varying from 1 to 20 mil were prepared by printing a silver ink on the untreated and coated Melinex™ substrates by screen printing using a screen with a mesh count of 360 counts/inch and emulsion thickness of 7 µm. The silver ink contained 20 g of silver neodecanoate, 3.9 g of 2-ethyl-2-oxazoline and 0.25 g of Rokrapol™ 7075 resin. The samples were dried at 150° C. for 30 minutes prior to sintering by IPL (Novacentrix™ Pulse Forge 1300). The pulse length of the pulsed light was 1500 µs and the voltage ranged from 260V to 340V producing pulses with energies ranging from 1.06 J/cm$^2$ to 1.43 J/cm$^2$. Resistances across silver lines were measured using a voltmeter and their sheet resistance values were calculated based on the lengths and widths of the respective lines, as obtained from optical profilometry.

In FIG. 2A, the calculated sheet resistance vs. trace width is shown for samples processed with a sintering energy of 1.18 J/cm$^2$ for silver traces printed on Melinex™ coated with a film of polymer-wrapped BNNTs, compared to silver traces printed on untreated Melinex™. Here, the lowering of the sheet resistance for silver traces on the treated sample of Melinex™ is pronounced.

In FIG. 2B, the sintering energy is 1.06 J/cm$^2$ for samples of untreated Melinex™ and Melinex™ coated with a polymer-wrapped BNNT film. As in FIG. 2A, there is a marked lowering of the sheet resistance for the treated sample compared to the untreated sample.

FIGS. 2A-2B demonstrate that by processing silver traces that are formed on a PET substrate with a coating (or film) of polymer-wrapped BNNT by IPL sintering, the silver traces have lower sheet resistances, thus leading to better electrical properties compared to silver traces that are formed on the corresponding untreated substrate. This is a surprising effect that could not be predicted simply or directly from the heat-transfer properties of BNNT.

Figure 3A:
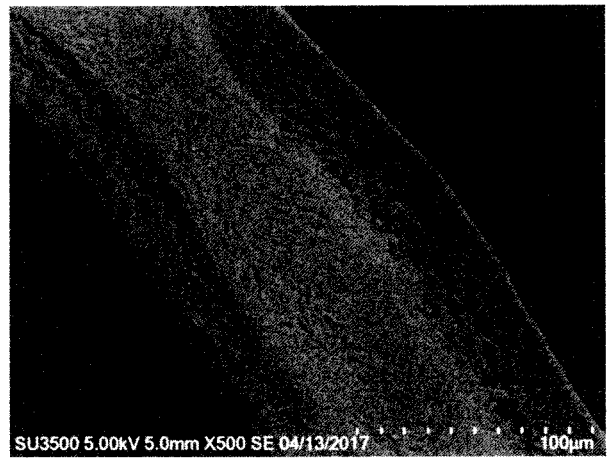
FIGS. 3A-3B each show a SEM image of the silver traces on the PET substrate following treatment with IPL.
Figure 3B:
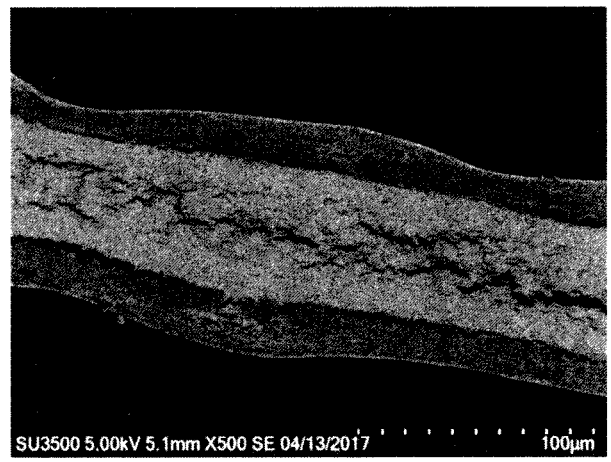

Scanning electron microscopy (SEM) images were obtained for silver traces with nominal widths of 2 mils and sintered with an energy of 1.18 J/cm$^2$. FIG. 3A shows the SEM image that was obtained for a silver trace on polymer-wrapped BNNTs supported on a PET substrate and FIG. 3B shows the SEM image that was obtained for a silver trace on an untreated PET substrate. A Hitachi SU3500 SEM was used to obtain both images with an accelerating voltage of 5 kV.

Since lower sintering energies can be used to prepare conductive silver traces on the coated samples, there is less warpage of the substrate in the coated samples, and less cracking of the silver film compared to the untreated samples. This can be seen in the SEM image of the BNNT-coated substrate (FIG. 3A) versus the untreated substrate (FIG. 3B).

Figure 4:
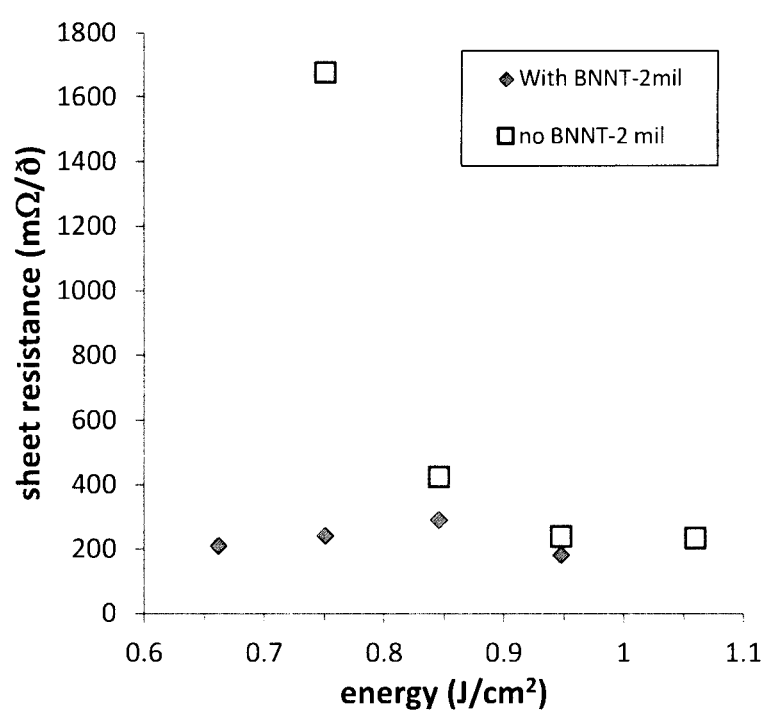
FIG. 4 illustrates the sheet resistance of silver traces with a nominal width of 2 mil vs. IPL sintering energy comparing, untreated Melinex™ to Melinex™ coated with BNNT.

FIG. 4 is a plot of the calculated sheet resistance of the silver traces vs. IPL sintering energy, for silver traces with nominal widths of 2 mil, comparing untreated Melinex™ to Melinex™ coated with polymer-wrapped BNNT.

FIG. 4 shows calculated sheet resistance values versus sintering energy obtained for silver traces with nominal widths of 2 mil, which were prepared by printing a silver ink on untreated Melinex™ substrates and Melinex™ substrates coated with polymer-wrapped BNNTs by screen printing using a screen with a mesh count of 360 counts/inch and emulsion thickness of 7 µm. The silver ink contained of 25 g of silver neodecanoate, 3.0 g of 2-ethyl-2-oxazoline, 3.0 g of dibutylether and 0.37 g of Rokrapol™ 7075 resin. The samples were dried at 160° C. for 30 minutes prior to sintering by IPL (Novacentrix™ Pulse Forge 1300). The pulse length of the pulsed light was 1500 µs and the voltage ranged from 230V to 270V producing pulses with energies ranging from 0.66 J/cm$^2$ to 1.06 J/cm$^2$. Resistances across silver lines were measured using a voltmeter and their sheet resistance calculated based on the lengths and widths of the lines obtained from optical profilometry.

In FIG. 4, there is a marked decrease in sheet resistance of the silver traces that are supported on polymer-wrapped BNNT substrates, for IPL energies less than 1 J/cm$^2$. FIG. 4 demonstrates that silver traces formed on polymer-wrapped BNNT coated substrates have lower sheet resistance at low sintering energies compared to silver traces formed on untreated BNNT substrates.

Figure 5:
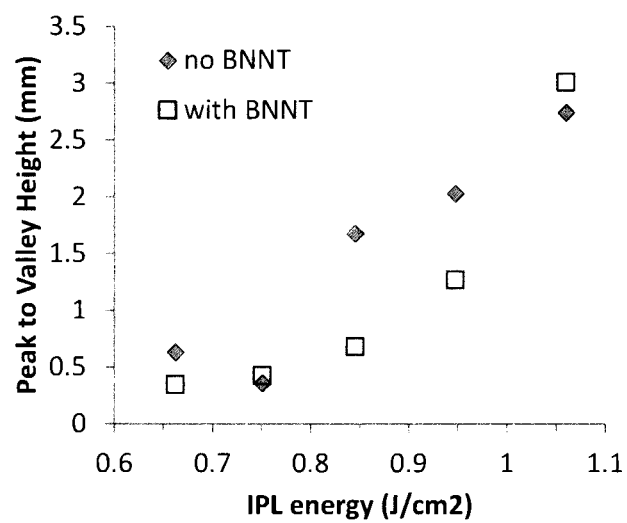
FIG. 5 illustrates the peak-to-valley height of the silver traces vs. IPL energy for silver traces with a 2 mil nominal width, comparing an untreated substrate with a BNNT-coated substrate.

FIG. 5 illustrates that the polymer-wrapped BNNT coating on the PET substrate minimizes the surface roughness that forms due to heat transfer during the IPL process. In this study the surface profiles of the traces that are discussed with reference to FIG. 4 above were measured using a CT100 optical profilometer by CyberTechnologies with a scan step of 1 µm. The peak-to-valley roughness measure defined by ScanSuite™ software was used to quantify the roughness of the silver lines.

Figure 6:
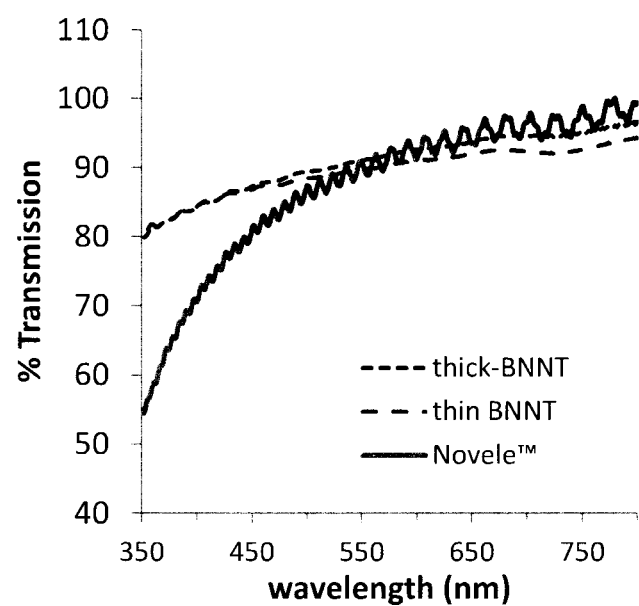
FIG. 6 illustrates the transmission of light at different wavelength, for different substrate samples.

FIG. 6 illustrates the transmission of light at different wavelengths, for different substrate samples. Melinex™ was coated with polymer-wrapped BNNT using a combination of the electrophoretic deposition and dry transfer methods described above. The transmission of light of the substrates was determined using a Cary 5000 UV-Vis spectrometer. The absorption measured using an untreated Melinex™ sample was subtracted from the absorption measured using the polymer-wrapped BNNT coated Melinex™ samples such that that % transmission in FIG. 6 is a measure of the BNNT only with no contribution from the Melinex™ substrate.

As shown in FIG. 6, for wavelengths less than 550 nm, BNNT-coated samples have a higher transmission of light compared to Novele™. This is advantageous for applications where a transparent substrate is required.

In summary, FIGS. 2-6 demonstrate that a BNNT coating, and more specifically a polymer-wrapped (modified) BNNT coating, on a plastic substrate allows for prints (i.e., Ag traces) to be sintered at lower energies in comparison to an untreated substrate. The substrate is less damaged after photonic sintering when the BNNT coating is present, based on peak to valley height measurements and SEM images that show few cracks in the silver film. Currently, the production of narrow line widths using IPL sintering is difficult since the substrate warps and silver does not form a continuous film. It appears that the BNNT coating lowers the sintering energies enough to allow narrow (50 μm or less) line widths to be processed on the substrate, with very little warping.

Figure 7:
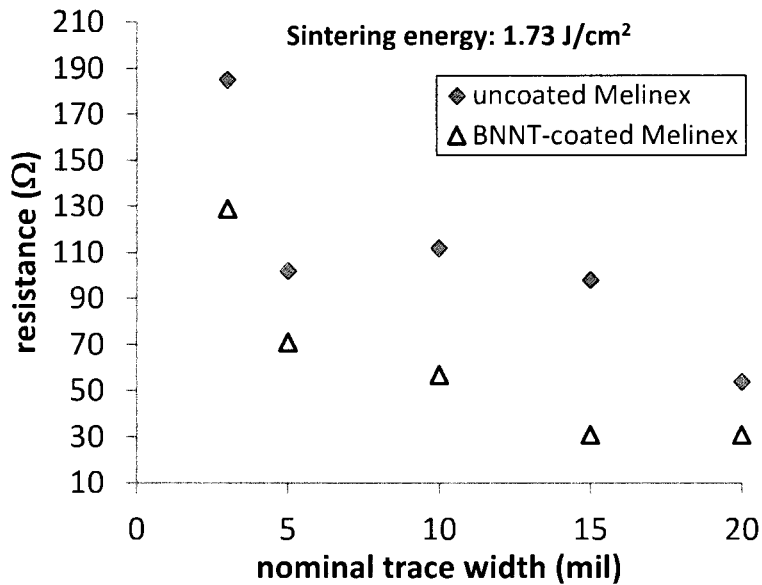
FIG. 7 illustrates sheet resistance of silver traces vs. their nominal width at a sintering energy of 1.73 $J/cm^2$ for samples of untreated Melinex™ and Melinex™ treated with a film of polymer-wrapped BNNT.

FIG. 7 illustrates calculated sheet resistance of silver traces vs. nominal trace width at a sintering energy of 1.73 J/cm$^2$ for samples of untreated Melinex™ and Melinex™ treated with a film of polymer-wrapped BNNT.

Example 2a: Silver Traces Formed on PET Coated with Polymer-Wrapped BNNT by Spray Coating A Melinex™ substrate coated with polymer-wrapped BNNTs was prepared as follows: a 0.1 mg/mL solution of regiorandom poly(3-hexylthiophene-2,5-diyl) (rra-P3HT) (PEHT-87K) wrapped BNNT in chloroform solvent was spray coated on Melinex™ using an Iwata Air Brush Studio Series Smart Jet air compressor, generating a film of 36 mg/m$^2$ of polymer-wrapped BNNTs on Melinex™.

An ink consisting of 15 g of silver neodecanoate, 3.2 g of 2-ethyl-2-oxazoline, 0.8 g of 1-octanol and 0.185 g of Rokrapol 7075™ was printed using a screen with a mesh of 360 counts/inch and 7 μm emulsion on polymer-wrapped BNNT-coated Melinex™ and on untreated Melinex™ (uncoated). The printed samples were dried in a convection oven for 15 minutes at 160° C. The samples were sintered using pulse light of 1500 μs and voltages ranging from 290V to 320V producing pulses with energies ranging from 1.30 J/cm$^2$ to 1.73 J/cm$^2$. Resistances across silver lines were measured using a voltmeter and their sheet resistance calculated based on the lengths and widths of the lines obtained from optical profilometry.

As shown in FIG. 7, the silver traces have a lower sheet resistance when printed and processed on BNNT-treated Melinex™.

Figure 8:
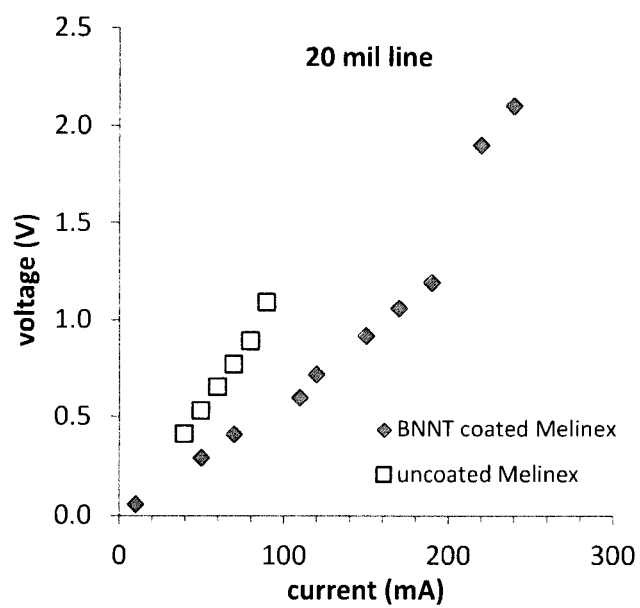
FIG. 8 illustrates voltage vs. current of silver traces with a nominal width of 20 mil sintered with 1.73 $J/cm^2$ pulsed light for the samples of untreated Melinex™ and Melinex™ treated with polymer-wrapped BNNT.

FIG. 8 illustrates voltage vs. current of silver traces with a nominal width of 20 mil sintered with 1.73 J/cm$^2$ pulsed light for the samples of untreated Melinex™ and Melinex™ coated in polymer-wrapped BNNT. As shown in FIG. 8, silver traces formed on Melinex™ coated in polymer-wrapped BNNT can carry higher currents before a short-circuit develops.

The current carrying capacity of silver lines printed on BNNT-coated PET and untreated PET are shown in Table 1. For traces with nominal widths of 3 and 20 mil, IPL sintering energies are 1.43 and 1.73 J/cm$^2$, respectively.

TABLE 1

| Sample | Line width (mil) | sintering energy (J/cm$^2$) | current carrying capacity (mA) |
|---|---|---|---|
| uncoated PET | 3 | 1.43 | 70 |
| BNNT-coated PET | 3 | 1.43 | 130 |
| uncoated PET | 20 | 1.73 | 90 |
| BNNT-coated PET | 20 | 1.73 | 240 |

Table 2 shows the average change in resistance of silver lines after undergoing the compressive test ASTM F1683-02. The bend and crease test shows that the silver traces have very poor mechanical properties on Novele™, improved mechanical properties when printed on PET, and excellent mechanical properties when printed on BNNT-coated PET:

TABLE 2

| SAMPLE | % Difference in resistance of 10 to 20 mil lines |
|---|---|
| PET | 0.651 +/− 1.63 |
| BNNT-coated PET | 0.933 +/− 0.91 |
| Novele ™ | 100% open fail |

Figure 9A:
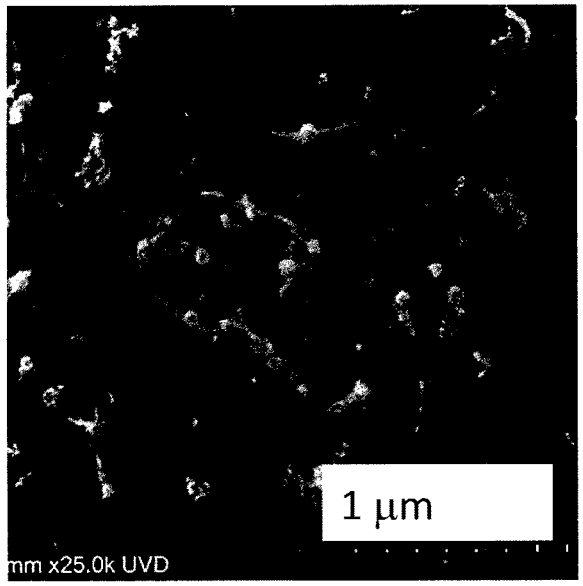
FIG. 9A shows a SEM image of PET coated with 36 $mg/m^2$ of BNNT.
Figure 9B:
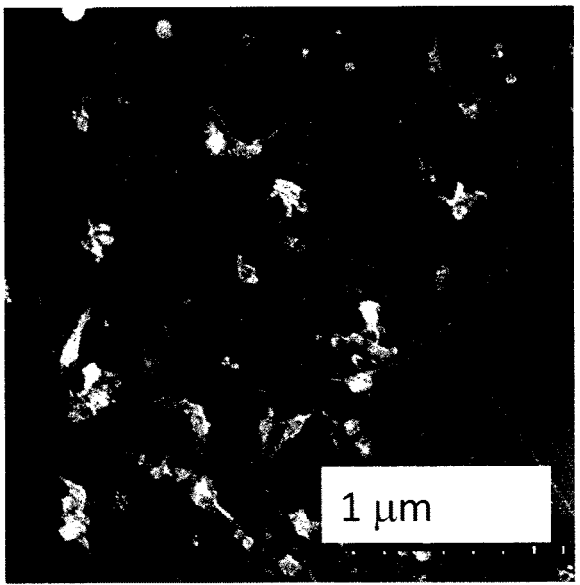
FIG. 9B shows a SEM image of PET coated with 71 $mg/m^2$ of BNNT.
Figure 9C:
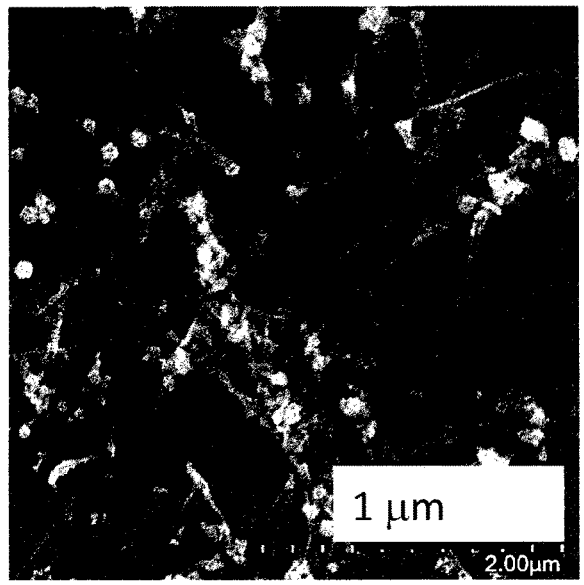
FIG. 9C shows a SEM image of PET coated with 142 $mg/m^2$ of BNNT.

Example 2b: Silver Traces Formed on PET Coated with Polymer-Wrapped BNNT by Spray Coating Using slightly different conditions than were described above for Example 2a, Melinex™ (ST505) substrates were coated with polymer-wrapped BNNTs as follows: a 0.2 mg/mL solution of regiorandom poly(3-hexylthiophene-2, 5-diyl) (rra-P3HT) (PEHT-87K) wrapped BNNT in chloroform solvent was spray coated on Melinex™ using an Iwata Air Brush Studio Series Smart Jet air compressor. FIG. 9 shows SEM images of Melinex™ coated with films of A) 36 mg/m$^2$ of polymer-wrapped BNNTs, B) 71 mg/m$^2$ of polymer-wrapped BNNTs and C) 142 mg/m$^2$ of polymer-wrapped BNNTs.

Figure 10:
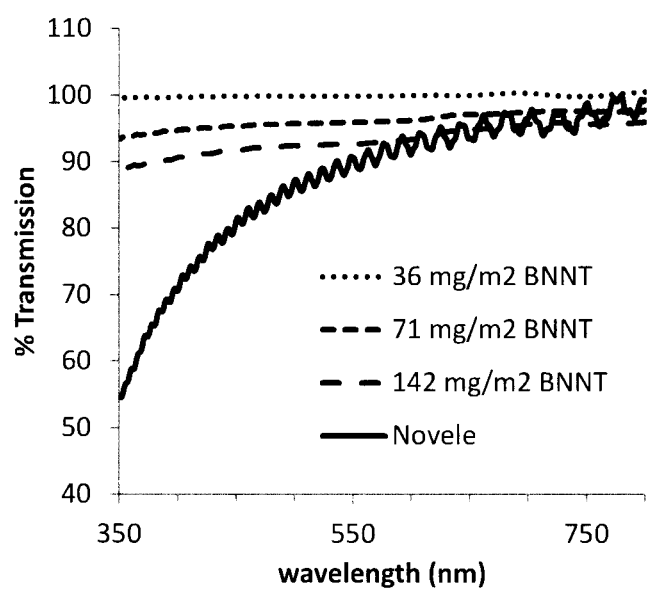
FIG. 10 shows the UV-Vis transmission spectrum of PET substrates coated with various concentrations of BNNT. The UV-Vis transmission of commercially available Novele is included for comparison.

The light transmission of the BNNT films on Melinex™ were measured using a Cary 5000 spectrometer, with an uncoated Melinex sample acting as a background for the measurement. FIG. 10 shows the transmission of 350-700 nm wavelength light through Melinex™ coated with films of 36, 71 and 142 mg/m$^2$ of polymer-wrapped BNNTs. As a comparison, transmission of Novele™ is included, illustrating the lower light transmission of the Novele™ substrate, at least below about 600 nm.

An ink containing 25 g of silver neodecanoate, 3.28 g of 2-ethyl-2-oxazoline, 1.97 g of 1-octanol and 0.30 g of Rokrapol 7075™ was printed using a screen with a mesh of 360 counts/inch and 7 μm emulsion onto polymer-wrapped BNNT coated Melinex™ substrates and onto untreated Melinex™ substrates (uncoated). The printed samples were dried in a convection oven for 15 minutes at 155° C., sintered using pulse light of 3000 μs and voltages ranging from 270V to 330V producing pulses with energies ranging from 1.96 J/cm$^2$ to 3.41 J/cm$^2$.

A CT-100 optical profilometer from Cyber Technologies was used to measure the width and roughness of the resulting sintered traces. Table 3 shows the roughness of the silver traces with a nominal width of 20 mil prepared on an uncoated Melinex™ substrate and on a polymer-wrapped BNNT coated substrate. Using three different measures of roughness ($R_q$, $R_t$, $R_z$), the roughness of the traces decreases with increasing concentration of surface concentration of BNNT. More particularly: $R_q$ is defined as the root mean square average of the profile height deviations from the mean line, recorded within the evaluation length; $R_t$ is defined as the difference between the height of the highest peak and the depth of the deepest valley within the evaluation length; $R_z$ is defined as the sum of the height of the highest profile peak and the depth of the deepest profile valley, relative to the mean line, within a sampling length.

TABLE 3

| surface concentration of BNNT | $R_q$ (mm) | Rt (mm) | Rz (mm) |
| --- | --- | --- | --- |
| 0 mg/m² | 3.6 | 21.1 | 12.4 |
| 36 mg/m² BNNT | 5.5 | 25.5 | 17.8 |
| 71 mg/m² BNNT | 3.5 | 19.5 | 11.9 |
| 142 mg/m² BNNT | 2.8 | 16.9 | 10.4 |

Figure 11:
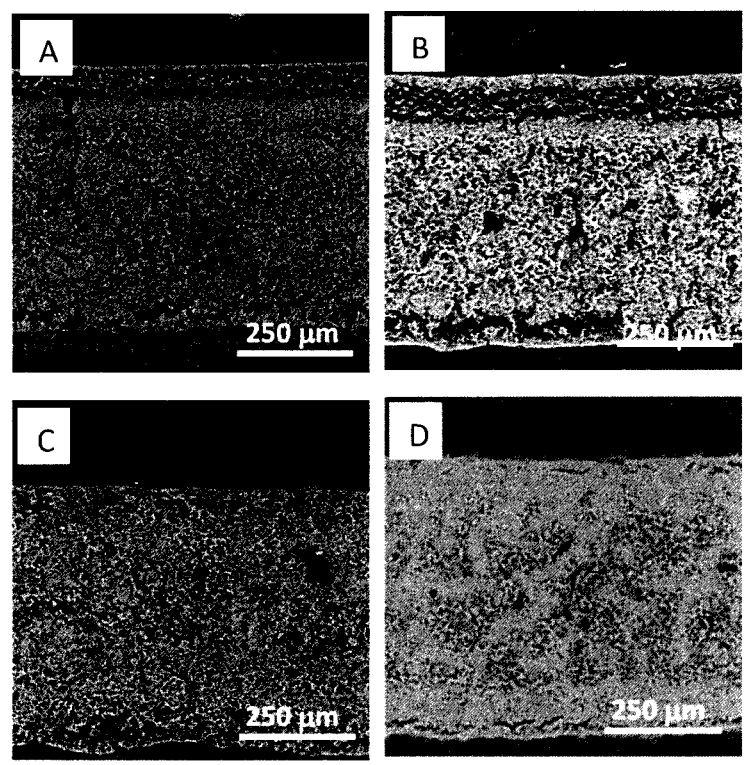
FIG. 11A shows an SEM image of a silver trace with a nominal width of 20 mil printed on PET treated with no coating and sintered at 2.62 $J/cm^2$ of IPL light.
FIG. 11B shows an SEM image of a silver trace with a nominal width of 20 mil printed on PET treated with 36 $mg/m^2$ BNNT and sintered at 2.62 $J/cm^2$ of IPL light.
FIG. 11C shows an SEM image of a silver trace with a nominal width of 20 mil printed on PET treated with 71 $mg/m^2$ BNNT and sintered at 2.62 $J/cm^2$ of IPL light.
FIG. 11D shows an SEM image of a silver trace with a nominal width of 20 mil printed on PET treated with 142 $mg/m^2$ BNNT and sintered at 2.62 $J/cm^2$ of IPL light.
Figure 12:
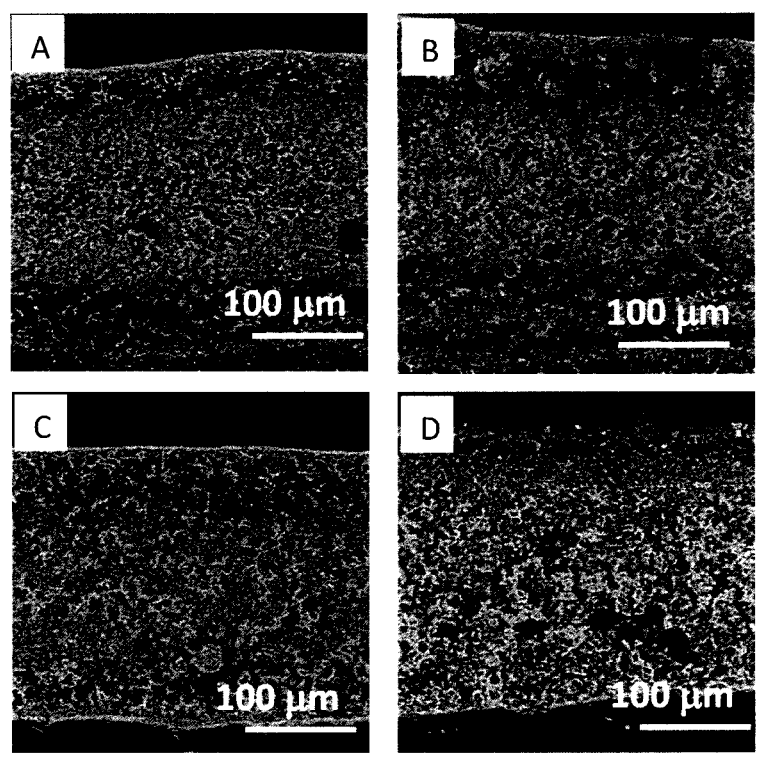
FIG. 12A shows an SEM image of a silver trace with a nominal width of 5 mil printed on PET treated with no coating and sintered at 2.62 $J/cm^2$ of IPL light.
FIG. 12B shows an SEM image of a silver trace with a nominal width of 5 mil printed on PET treated with 36 $mg/m^2$ BNNT and sintered at 2.62 $J/cm^2$ of IPL light.
FIG. 12C shows an SEM image of a silver trace with a nominal width of 5 mil printed on PET treated with 71 $mg/m^2$ BNNT and sintered at 2.62 $J/cm^2$ of IPL light.
FIG. 12D shows an SEM image of a silver trace with a nominal width of 5 mil printed on PET treated with 142 $mg/m^2$ BNNT and sintered at 2.62 $J/cm^2$ of IPL light.

SEM images of the silver lines were acquired. The bright areas in the images are the silver traces. As shown in FIG. 11 (for traces 20 mil in width) and in FIG. 12 (for traces 5 mil in width), SEM images show an increase in uniformity and less cracking in the silver traces with increasing concentration of BNNT on Melinex™ (PET), where in FIG. 11 and in FIG. 12 respective parts A) are with no coating, parts B) are with 36 mg/m² polymer-wrapped BNNT, parts C) are with 71 mg/m² polymer-wrapped BNNT, and parts D) are with 142 mg/m² polymer-wrapped BNNT.

Figure 13A:
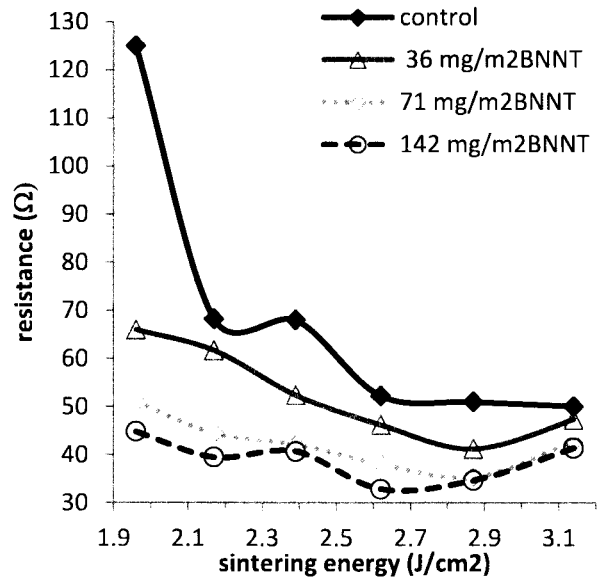
FIG. 13A shows the resistance of silver traces 10 cm in length and with nominal widths of 20 mil.
Figure 13B:
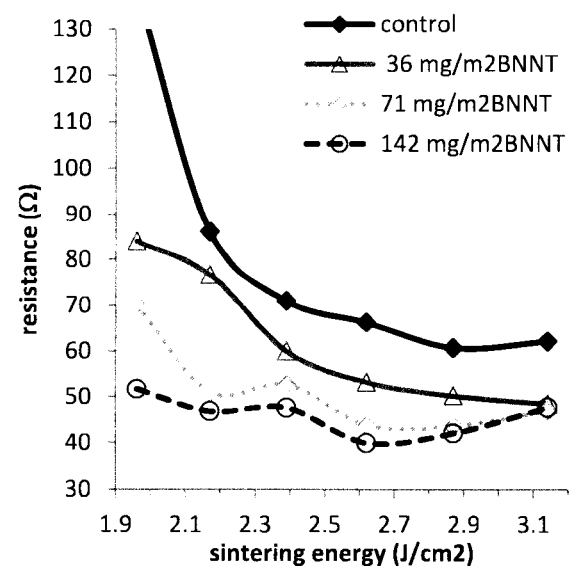
FIG. 13B shows the resistance of silver traces 10 cm in length and with nominal widths of 15 mil.
Figure 13C:
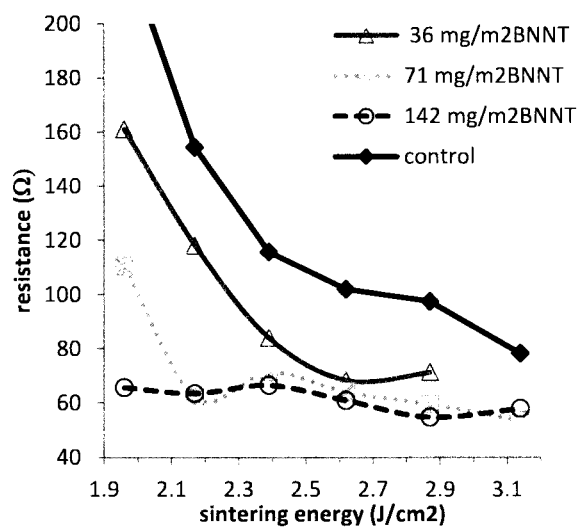
FIG. 13C shows the resistance of silver traces 10 cm in length and with nominal widths of 10 mil.

FIG. 13 shows plots of resistance vs. photosintering energies for silver traces of 10 cm in length and nominal widths of A) 10 mil, B) 15 mil, and C) 20 mil, printed and sintered at varying photosintering energies on uncoated and polymer-wrapped BNNT coated Melinex™ (PET). The resistances of the resulting traces were measured using an ohm meter. FIG. 13 shows that for all trace widths and all photosintering energies, the silver traces on polymer-wrapped BNNT coated Melinex™ (PET) are less resistive, and that the greater the surface concentration of polymer-wrapped BNNT on Melinex™ (PET), the less resistive the traces are.

Figure 14:
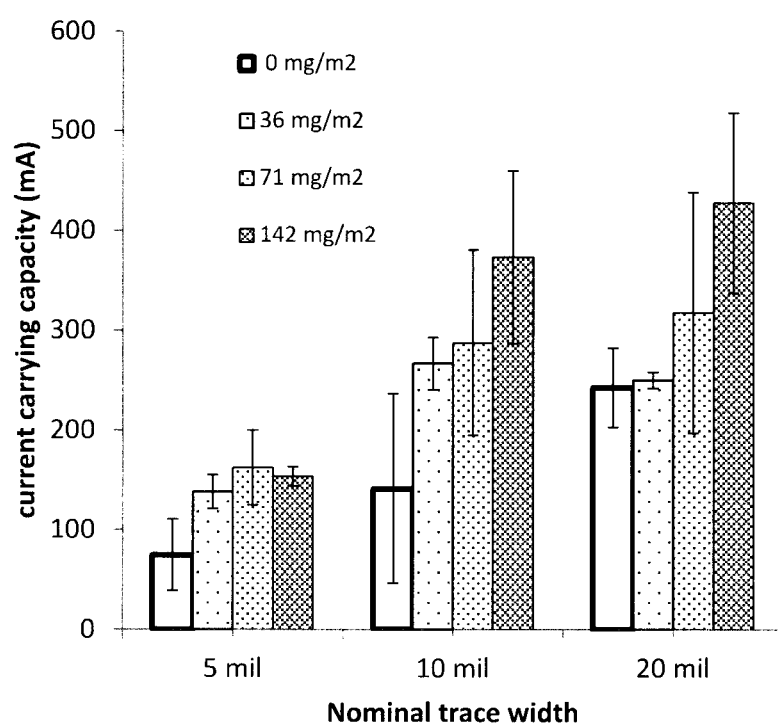
FIG. 14 shows the current carrying capacity of photosintered silver traces with nominal trace widths of 5, 10 and 20 mil in width.

The current carrying capacities shown in FIG. 14 were measured using a two probe technique and multimeter. The conductance through lines of different widths was measured as the applied current was incrementally increased up to a current that caused electrical failure. At each current level, the current was maintained for 30 seconds before the conductance was recorded. The point of failure is defined as the current carrying capacity. The results of the current carrying capacity measurements shown in FIG. 14 indicate that the higher the concentration of polymer-wrapped BNNT on the Melinex™ (PET) substrate, the higher the current that can be applied to the silver traces prior to causing the trace to short and fail.

Example 3: Silver Traces Formed on PETG Coated with Polymer-Wrapped BNNT by Spray Coating PETG substrates were coated with polymer-wrapped BNNTs as follows: a 0.2 mg/mL solution of regiorandom poly(3-hexylthiophene-2,5-diyl) (rra-P3HT) (PEHT-87K) wrapped BNNT in chloroform solvent was spray coated on PETG using a Iwata Air Brush Studio Series Smart Jet air compressor, generating a films 142 mg/m² of BNNTs on PETG.

Figure 15:
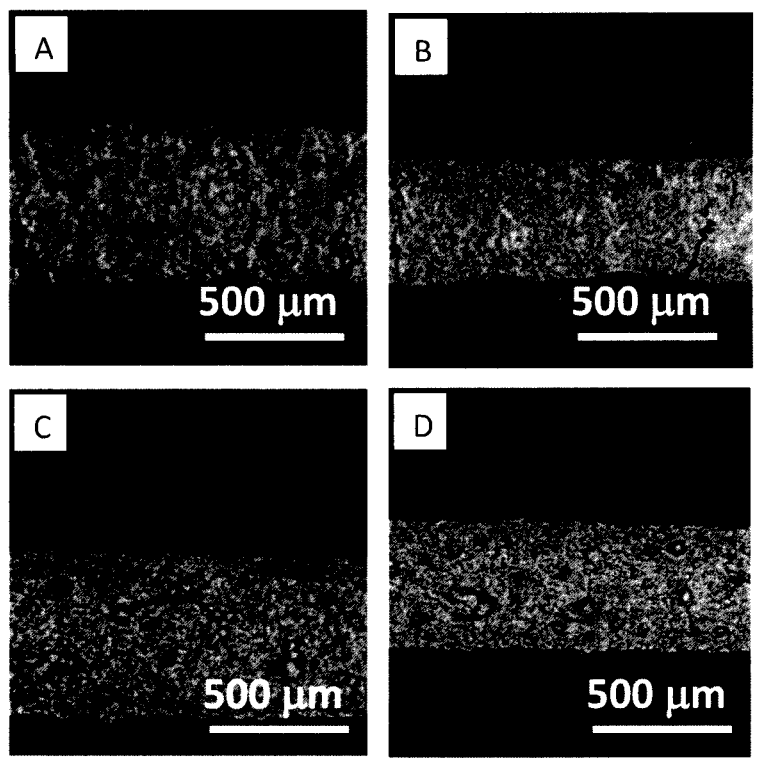
FIG. 15A shows an optical micrograph of a trace with a nominal width of 20 mil, thermoformed, and sintered on uncoated PETG.
FIG. 15B shows an optical micrograph of a trace with a nominal width of 15 mil, thermoformed, and sintered on uncoated PETG.
FIG. 15C shows an optical micrograph of a traces with a nominal width of 20 mil, thermoformed, and sintered on BNNT-coated PETG.
FIG. 15D shows an optical micrograph of a traces with a nominal width of 15 mil, thermoformed and sintered on BNNT-coated PETG.

An ink was prepared by mixing, in a weight to weight ratio, 0.6385 of silver oxalate, 1.000 of an amine mixture, 0.13067 di(propylene glycol) methyl ether, 0.01596 of lactic acid, 0.035250 of 0.4% solution of antifoam 204 and 0.05612 of BYK-R605™. The amine mixture was a mixture of, weight to weight, 2.67 amino-2-propanol, 1.000 of 2-amino-1-butanol, and, 0.0494 hydroxyethylcellulose (90 000 g/mol). The ink was printed using a screen with a mesh of 360 counts/inch and 7 μm emulsion on uncoated PETG substrates and on PETG substrates coated with polymer-wrapped BNNT. The samples were thermoformed into a half cylinder shape with a height of 1.5 cm using a FormTech450DT thermoformer with heating at 50% power for 53 seconds. The printed sample was positioned such that the printed line pattern covered the half cylinder. Following thermoforming, the samples were sintered using pulse light of with a voltage of 250V 3000 μs generating 2.72 J/cm² of energy. Optical microscope images of the traces were acquired as shown in FIG. 15. More particularly, FIG. 15 shows traces printed, thermoformed, and sintered on uncoated PETG with nominal widths of A) 20 mil and B) 15 mil, as well as traces printed, thermoformed and sintered on polymer-wrapped BNNT coated PETG with nominal widths of C) 20 mil and D) 15 mil. The images show large cracks in the traces printed and photosintered on uncoated PETG. The cracks in the silver traces are absent in the sample printed on polymer-wrapped BNNT coated PETG.

The resistances of printed, thermoformed and photosintered silver traces 10 cm in length and with varying nominal widths were measured. The silver traces were measured using an ohm meter. Table 4 compares the resistance of traces with 5, 10, 15 and 20 mil in nominal widths printed on uncoated PETG with those on polymer-wrapped BNNT coated PETG. The results show that the traces with narrow line widths (5, 10, 15 mil) on polymer-wrapped BNNT coated PETG substrates are conductive while those on uncoated PETG are non-conductive (NC) on average. The polymer-wrapped BNNT coating allows conductive silver traces with narrow widths to form after printing, thermoforming and photosintering.

TABLE 4

| Nominal line width | Sample 1 Resistance (Ω) | Sample 2 Resistance (Ω) | Sample 3 Resistance (Ω) |
| --- | --- | --- | --- |
| Uncoated PETG | | | |
| 20 mil | 64 | 56 | 56 |
| 15 mil | NC | NC | NC |
| 10 mil | 92 | NC | NC |
| 5 mil | NC | NC | NC |
| BNNT-coated PETG | | | |
| 20 mil | 121 | 90 | 129 |
| 15 mil | 177 | 132 | 181 |
| 10 mil | 338 | 239 | 330 |
| 5 mil | 1530 | 1067 | 1263 |

The silver traces were printed on uncoated PET and BNNT-coated PET with varying concentrations of BNNT, printed and photosintered with different sintering light energy.

It should be noted that while BNNTs wrapped in regio-random poly(3-hexylthiophene-2,5-diyl) (rra-P3HT) were used in a number of the examples, the following conjugated polymers presented in Table 5 may also be used to wrap BNNTs.

TABLE 5

| Structure | Substituents/Regioregularity | $M_n$* (kDa) | PDI** |
|---|---|---|---|
| 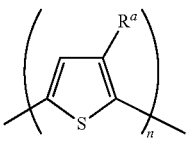<br>Polythiophene (PT) | $R^a = C_6H_{13}$ Regio-Random | 34 | 1.35 |
|  | $R^a = C_6H_{13}$ Regio-Regular | 60 | 2.3 |
|  | $R^a = C_{18}H_{37}$ Regio-Regular | 50.9 | 1.35 |
| 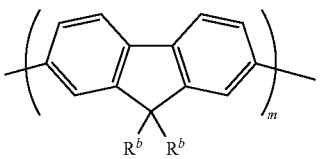<br>Polyfluorene (PF) | $R^b = C_8H_{17}$ | 22 | 2.41 |
|  | $R^b = C_{14}H_{29}$ | 13 | 3 |
|  | $R^b = C_{18}H_{37}$ | 59 | 4.5 |
| 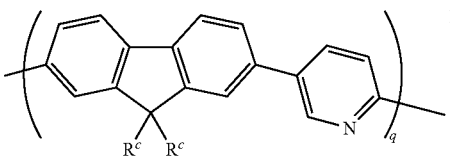<br>Polyfluorine-Pyridine (PFPy) | $R^c = C_{18}H_{37}$ | 38.5 | 3.21 |

*Number average molecular weight
**Polydispersity index

Specific examples have been provided in order to facilitate a better understanding of the claimed invention, and in particular the examples relate to polymer-wrapped (modified) BNNT coated onto polyethylene terephthalate or polyethylene terephthalate glycol substrates. As described with reference to Table 5 a variety of other polymers may be used to produce polymer-wrapped (modified) BNNT. In addition, the substrates are not limited to the polyethylene terephthalate or polyethylene terephthalate glycol substrates that were used in the examples but may also be selected from at least the following: polycarbonate, polyethylene naphthalate, polyimide, or a polyester. Further, in addition to polymer-wrapped (modified) BNNTs the invention may also be practiced using unmodified BNNTs or BNNTs that are modified covalently with functional groups (OH or $NH_2$).

The novel features will become apparent to those of skill in the art upon examination of the description. It should be understood, however, that the scope of the claims should not be limited by the embodiments but should be given the broadest interpretation consistent with the wording of the claims and the specification as a whole.

The invention claimed is:

1. A process, comprising:
 providing a plastic substrate;
 forming on at least a portion of a surface of the plastic substrate a layer comprising boron nitride nanotubes (BNNTs);
 forming a metallic ink trace on a portion of the layer comprising BNNTs, such that the metallic ink trace is spaced-apart from the plastic substrate by the layer comprising BNNTs; and
 sintering the metallic ink trace using photonic or thermal sintering techniques,
 wherein the BNNTs are modified BNNTs selected from polymer-wrapped BNNTs and BNNTs coated with a ligand or a surfactant.

2. The process of claim 1, wherein the polymer comprises a conjugated polymer selected from the group consisting of a polythiophene comprising at least one alkyl side chain, a polyfluorene comprising at least one alkyl side chain, a poly(fluorene-co-pyridine) comprising at least one alkyl side chain, or a poly(thiophene-co-fluorene) comprising at least one alkyl side chain.

3. The process of claim 1, wherein the sintering is intense pulsed light sintering.

4. The process of claim 1, wherein the metallic ink comprises silver, copper or nickel.

5. The process of claim 1, wherein the metallic ink is a molecular ink, a particulate ink or an ink comprising flakes, or any mixture thereof.

6. The process of claim 1, wherein prior to sintering, the metallic ink is applied to the composite by screen, inkjet, microplotting, flexure-gravure, offset printing or stencil printing.

7. The process of claim 1, wherein providing the plastic substrate comprises providing a substrate fabricated from one of the following: polycarbonate (PC), polyethylene terephthalate (PET), polyethylene terephthalate glycol PETG, polyethylene naphthalate (PEN), polyimide, and a polyester.

8. A process, comprising:
 providing a plastic substrate;
 forming on at least a portion of a surface of the plastic substrate a layer comprising boron nitride nanotubes (BNNTs);

forming a metallic ink trace on a portion of the layer comprising BNNTs, such that the metallic ink trace is spaced-apart from the plastic substrate by the layer comprising BNNTs; and sintering the metallic ink trace using photonic or thermal sintering techniques, wherein the BNNTs are modified BNNTs that comprise pendant hydroxyl (OH) and amino ($NH_2$) functional groups covalently bonded to an outer surface of the BNNT, preferably the number of pendant OH groups is between about 1 OH per 6 BN-units and about 1 OH per 240 BN-units.

9. The process of claim 8, wherein the number of pendant OH groups is between about 1 OH per 12 BN-units and about 1 OH per 124 BN-units.

10. The process of claim 9, wherein the number of pendant OH groups is about 1 OH per 18 BN-units.

11. The process of claim 8, wherein the sintering is intense pulsed light sintering.

12. The process of claim 8, wherein the metallic ink comprises silver, copper or nickel.

13. The process of claim 8, wherein the metallic ink is a molecular ink, a particulate ink or an ink comprising flakes, or any mixture thereof.

14. The process of claim 8, wherein prior to sintering, the metallic ink is applied to the composite by screen, inkjet, microplotting, flexure-gravure, offset printing or stencil printing.

15. The process of claim 8, wherein providing the plastic substrate comprises providing a substrate fabricated from one of the following: polycarbonate (PC), polyethylene terephthalate (PET), polyethylene terephthalate glycol PETG, polyethylene naphthalate (PEN), polyimide, and a polyester.

* * * * *